(12) United States Patent
Chang et al.

(10) Patent No.: US 11,573,265 B2
(45) Date of Patent: Feb. 7, 2023

(54) ELECTRICAL COMPONENT TESTING METHOD AND TEST PROBE

(71) Applicants: Min-Hung Chang, Taoyuan (TW); Ching-Lin Lee, Taoyuan (TW); Chin-Yuan Chang, Taoyuan (TW); Cheng-Hung Pan, Taoyuan (TW); Mao-Sheng Liu, Taoyuan (TW); Tzu-Tu Chao, Taoyuan (TW)

(72) Inventors: Min-Hung Chang, Taoyuan (TW); Ching-Lin Lee, Taoyuan (TW); Chin-Yuan Chang, Taoyuan (TW); Cheng-Hung Pan, Taoyuan (TW); Mao-Sheng Liu, Taoyuan (TW); Tzu-Tu Chao, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 177 days.

(21) Appl. No.: 16/810,855

(22) Filed: Mar. 6, 2020

(65) Prior Publication Data
US 2020/0284834 A1 Sep. 10, 2020

(30) Foreign Application Priority Data
Mar. 8, 2019 (TW) .................. 108107696

(51) Int. Cl.
*G01R 31/28* (2006.01)

(52) U.S. Cl.
CPC ................. *G01R 31/2889* (2013.01)

(58) Field of Classification Search
CPC ............... G01R 31/28; G01R 31/2889; G01R 31/2635; G01R 31/26; G01R 31/00; G01R 1/07378; G01R 31/2886; G01R 1/07314; G01R 1/07371
See application file for complete search history.

(56) References Cited

U.S. PATENT DOCUMENTS

2020/0233033 A1* 7/2020 Kim ................... G01R 1/07314

* cited by examiner

*Primary Examiner* — Jermele M Hollington
*Assistant Examiner* — Suresh K Rajaputra

(57) ABSTRACT

Herein disclosed are a method and a test probe for testing an electrical component. The electrical component comprises at least a first electrode and a second electrode. The method comprises the following steps: covering the first electrode with a first conducting flexible layer; driving a first electrode contact to electrically connect a first end of the first electrode contact with the first electrode via the first conducting flexible layer; covering the second electrode with a second conducting flexible layer; and driving a second electrode contact to electrically connect a second end of the second electrode contact with the second electrode via the second conducting flexible layer. The first conducting flexible layer is an anisotropic conductive film.

8 Claims, 9 Drawing Sheets

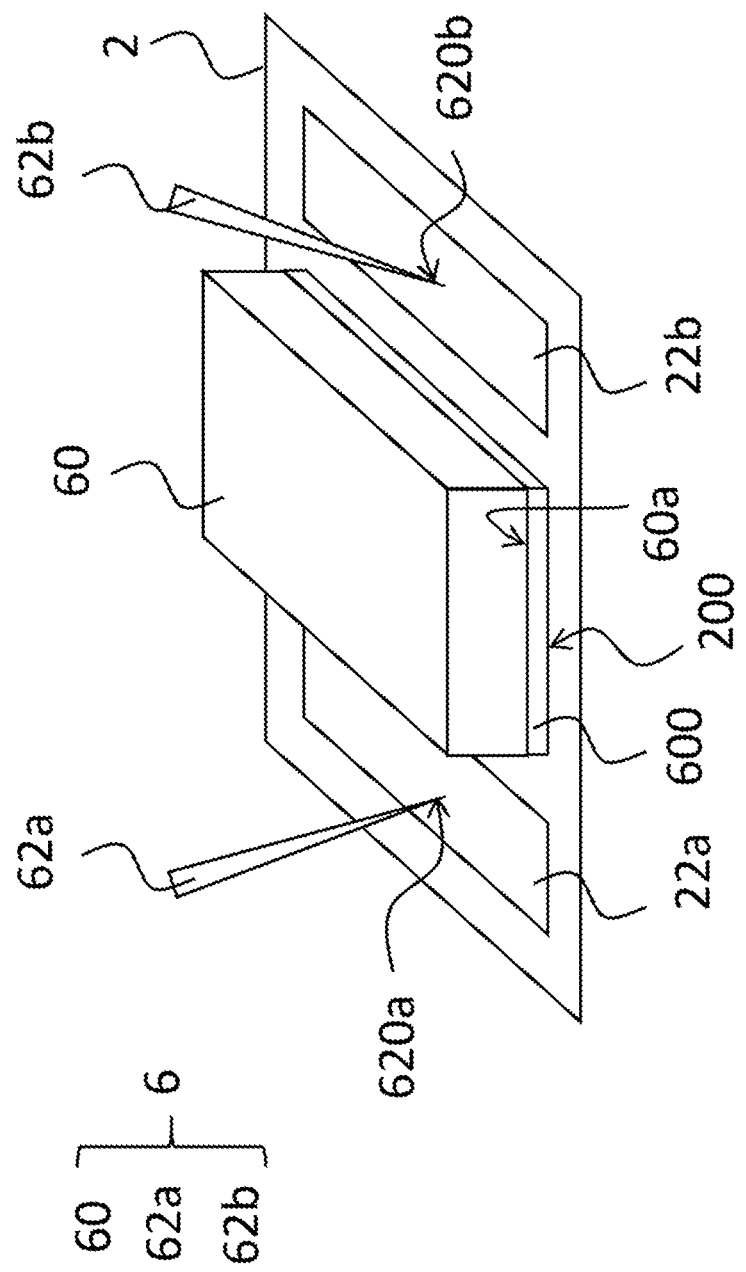

ELECTRICAL COMPONENT TESTING METHOD AND TEST PROBE

CROSS REFERENCE TO RELATED APPLICATION

The present application claims priority to Taiwan patent application Serial No. 108107696 filed on Mar. 8, 2019, the entire content of which is incorporated by reference to this application.

BACKGROUND OF THE INVENTION

1. Field of the Invention

The present invention pertains to an electrical component testing method and a test probe, in particular those that are applicable to electrodes with uneven surfaces.

2. Description of the Prior Art

The smaller electrical components are, the more challenging it is to test them. To test a conventionally sized device, say a LED or a laser diode, for its characteristics, one could use a test probe to make contact with the electrodes and feed the driving current into the luminescent diode. Yet the electrodes have become increasingly microscopic and elusive as the diode is scaled down from being microns-wide to nanometers in dimension. Some components even have electrodes that are printed with patterns and hence unevenly surfaced. In any case, the test probe would have a hard time pinpointing the electrodes, not to mention contacting them while secured in angle and position.

What is called for, then, is an innovative testing method, along with the associated test probe, that is applicable to electrical components that are miniaturized and potentially with purpose-formed electrodes.

SUMMARY OF THE INVENTION

The present invention provides an electrical component testing method where an electrode is electrically connected with an electrode contact while covered with a conducting flexible layer. The method is applicable to minuscule electrical components and various electrodes with patterned or uneven surfaces.

The present invention discloses a method for testing an electrical component. The electrical component comprises at least a first electrode and a second electrode. The method comprises the following steps: covering the first electrode with a first conducting flexible layer; driving a first electrode contact to electrically connect a first end of the first electrode contact with the first electrode via the first conducting flexible layer; and driving a second electrode contact to electrically connect a second end of the second electrode contact with the second electrode. The first conducting flexible layer is an anisotropic conductive film.

In one embodiment, the first electrode consists of a plurality of first subsidiary electrodes, and the first conducting flexible layer covers at least part of the first subsidiary electrodes. The first and second electrodes may be separated by a first distance, and the first subsidiary electrodes may be spaced a second distance apart, the first distance being greater than the second distance.

Said method may further comprise covering the second electrode with the first conducting flexible layer. When the second electrode contact is driven, the second end of the second electrode contact is electrically connected with the second electrode via the first conducting flexible layer. Alternatively, said method may further comprise covering the second electrode with a second conducting flexible layer, and when the second electrode contact is driven, the second end is electrically connected with the second electrode via the second conducting flexible layer instead.

The present invention also provides a test probe where a conducting flexible layer is disposed at an electrode contact. The test probe is applicable to minuscule electrical components and various electrodes with patterned or uneven surfaces.

The present invention discloses a test probe for testing an electrical component. The electrical component comprises at least a first electrode and a second electrode. The test probe comprises a first electrode contact and a second electrode contact. The first electrode contact has a first end, at which a first conducting flexible layer is disposed. The first conducting flexible layer is configured to detachably contact the first electrode; when the contact is made, the first end is electrically connected with the first electrode via the first conducting flexible layer. The second electrode contact has a second end, which is configured to contact and be electrically connected with the second electrode detachably.

In one embodiment, the first conducting flexible layer is an anisotropic conductive film. There may also be a conducting adhesive layer between the first end and the first conducting flexible layer. Said first electrode may consist of a plurality of first subsidiary electrodes; when the first conducting flexible layer contacts the first electrode, the first conducting flexible layer covers at least part of the first subsidiary electrodes. A second conducting flexible layer may be disposed at the second end of the second electrode contact and configured to detachably contact the second electrode. When the second conducting flexible layer contacts the second electrode, the second end is electrically connected with the second electrode via the second conducting flexible layer.

To summarize: A conducting flexible layer serves as a medium between an electrode and an electrode contact in the electrical component testing method and the test probe provided by the present invention. Covering the uneven surface of the electrode with the elastic, relatively smooth layer before the electrode contact approaches the electrode reduces measurement errors and inaccuracy. When the electrode consists of many minuscule subsidiaries, the conducting flexible layer has the additional bonus of being able to cover them at once, removing the burden to connecting them one by one electrically. The present invention, therefore, is applicable to various patterned electrodes.

BRIEF DESCRIPTION OF THE APPENDED DRAWINGS

FIG. 5 depicts a test probe and an electrical component, in accordance with an embodiment of the present invention.

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
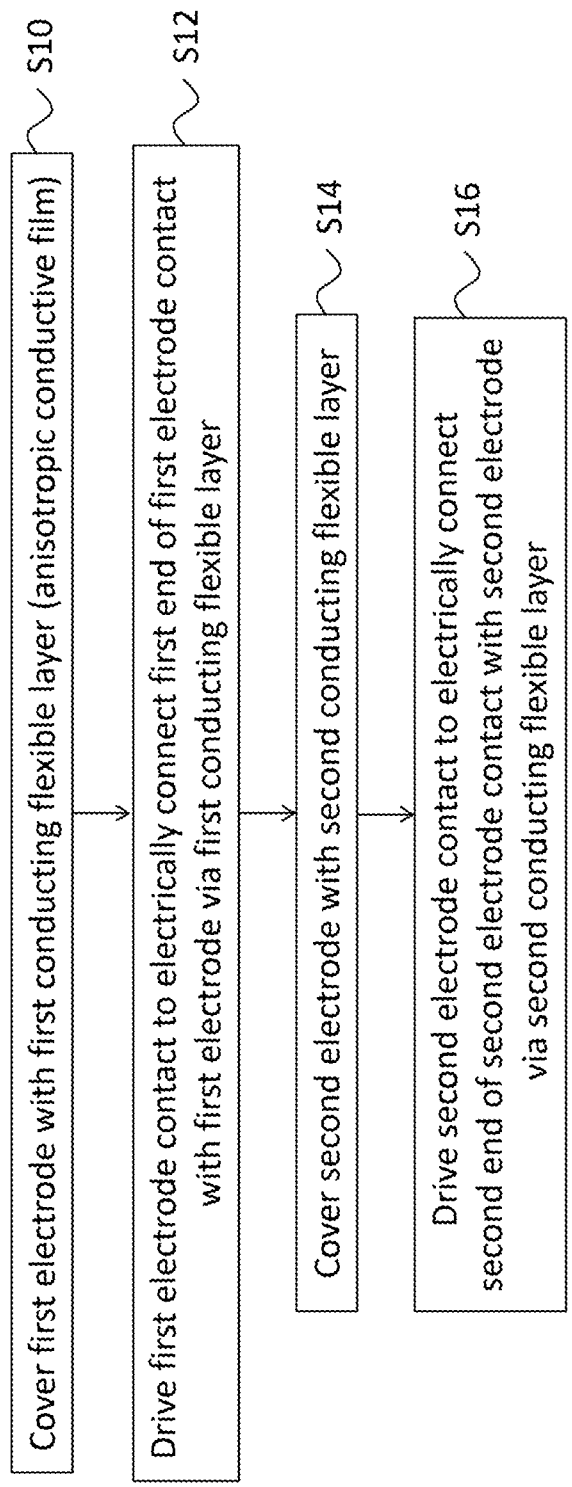
FIG. 1 is the flow chart of an electrical component testing method in accordance with an embodiment of the present invention.
Figure 2A:
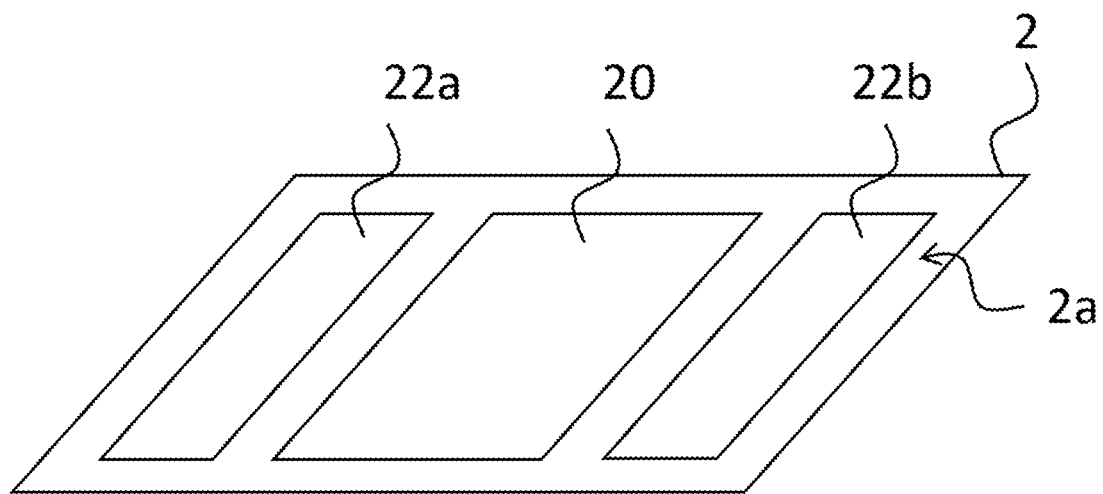
FIG. 2A depicts an electrical component, in accordance with an embodiment of the present invention.

Please refer to FIGS. 1 and 2A in conjunction. FIG. 1 is the flow chart of an electrical component testing method in accordance with an embodiment of the present invention, and FIG. 2A depicts an electrical component 2. The testing method of the present embodiment can be applied to the electrical component 2, which may be, but is not limited to being, a die, a chip, part of a wafer, or any device with two or more electrodes. The end usage of the electrical component 2 also does not concern the present embodiment. The component 2 may be a light-emitting diode (LED), an organic LED (OLED), a laser diode (LD), a chipset, or any device using flip-chip packaging. Suppose that the electrical component 2 is a LED undergoing tests. On the testbed, the component 2 is given voltage or current at its electrodes 20, 22a, and 22b, which are located on one side of the component 2, to yield results regarding its luminescent efficacy, color temperature, etc.

Although FIG. 2A depicts the electrical component 2 as having the electrode 20 (first electrode), the electrode 22a (second electrode), and the electrode 22b, the present embodiment does not require its subject to have three electrodes to work. The component 2 may well feature just two electrodes in practice. Assume again the electrical component 2 to be a LED. The electrodes 20, 22a, and 22b correspond to one of two polarities of the component 2. For instance, the electrode 20 may be the LED's positive terminal, and the electrodes 22a and 22b the negative one. It does not matter what sizes and forms the electrodes 20, 22a, and 22b are. They may be of varying heights and thus rise above the upper surface 2a of the electrical component 2. Looking down on the upper surface 2a, one may observe that the electrodes 20, 22a, and 22b appear rectangular, but they can also be any other shape.

Figure 2B:
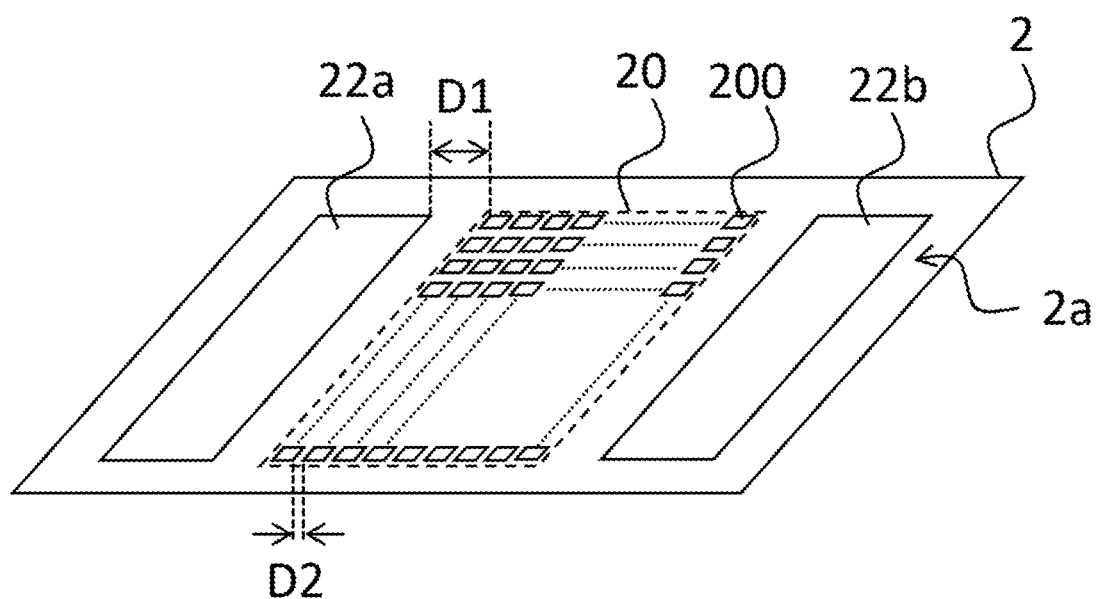
FIG. 2B depicts an electrical component, in accordance with another embodiment of the present invention.

In one example, the electrode 20 consists of a plurality of subsidiaries (first subsidiary electrodes). Please refer to FIG. 2B, which depicts the electrical component 2 in accordance with another embodiment of the present invention. As shown in FIG. 2B, the electrode 20 has many subsidiaries 200, whose sizes and shapes need not be specified herein. Again, the subsidiary electrodes 200 may be of varying heights and thus rise above the upper surface 2a. Looking down on the upper surface 2a, one may observe that the subsidiary electrodes 200 appear rectangular, but they can also be patterned otherwise. Along one direction, the electrodes 20 and 22a are separated by a distance D1 (first distance), while the subsidiary electrodes 200 are spaced a distance D2 (second distance) apart; that is, each neighboring pair of subsidiaries 200 are separated by D2. Given the fact the electrodes 20 and 22a are of opposite polarities, the distance D1 should be significant and considered safe enough for short circuits not to form between the electrodes 20 and 22a and cause damage to the electrical component 2. An adequate distance D1 is contingent upon, say, the operating voltage or current of the component 2, and not under the remit of the present embodiment. The distance D2, on the other hand, is defined between the same-polarity subsidiary electrodes 200, where there is little safety concern with regard to short circuits formed. The distance D1, therefore, is at least slightly greater than the distance D2.

Figure 3A:
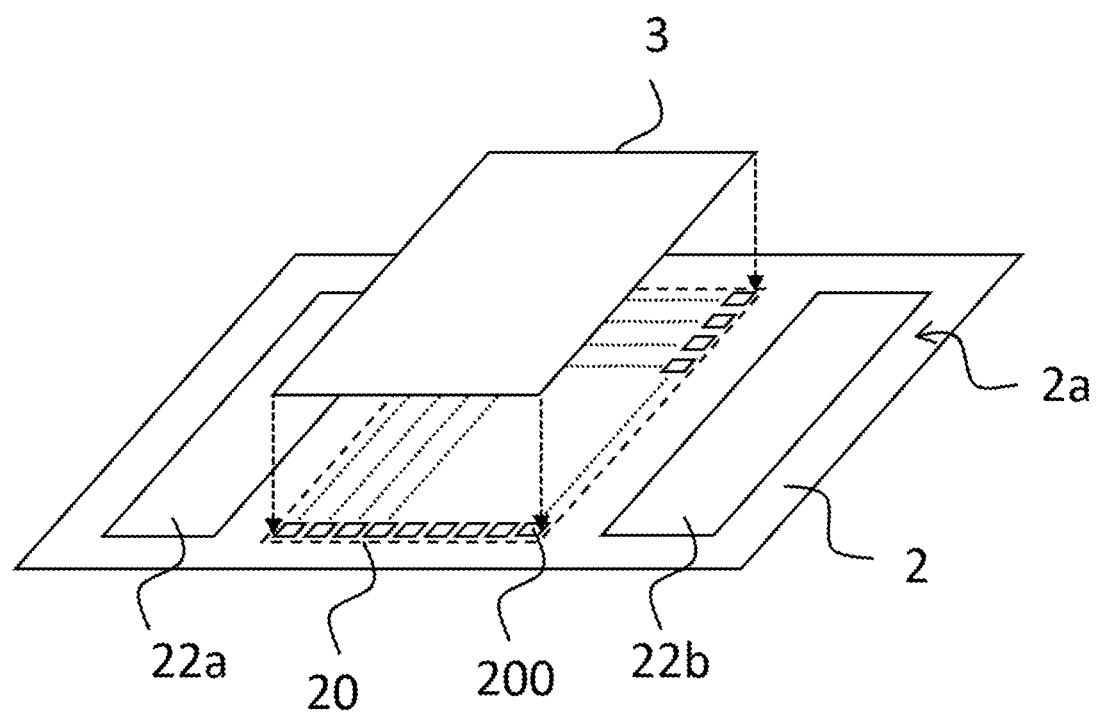
FIG. 3A depicts an execution of step S10 in accordance with FIG. 1.
Figure 3B:
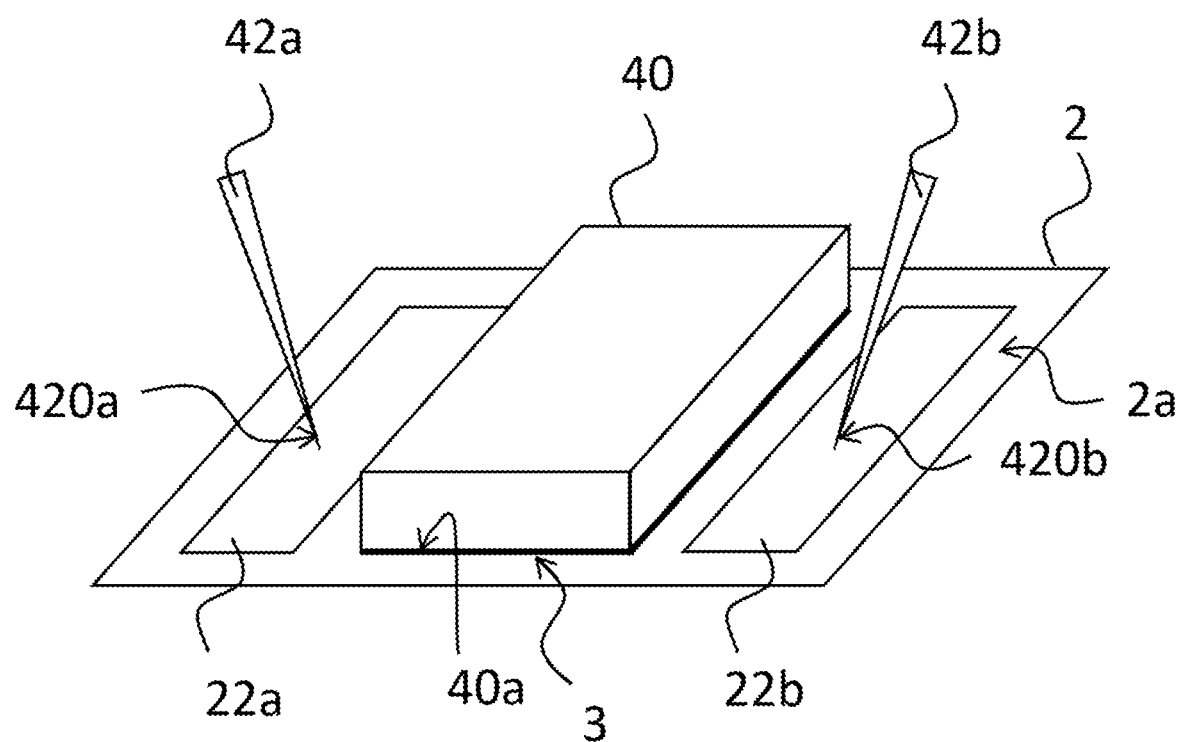
FIG. 3B depicts an execution of steps S12 and S16 in accordance with FIG. 1.

The electrical component testing method of the present embodiment is best illustrated with FIGS. 1, 3A, and 3B in accordance with FIG. 2B, where the electrode 20 (first electrode) of the electrical component 2 consists of the subsidiaries 200 (first subsidiary electrodes). A person skilled in the art would no doubt agree that said testing method works with the unitary first electrode of FIG. 2A as well. FIG. 3A depicts an execution of step S10 from FIG. 1, while FIG. 3B depicts that of steps S12 and S16. As step S10 is shown in FIG. 3A, the subsidiary electrodes 200 is covered with a conducting flexible layer 3 (first conducting flexible layer). The subsidiaries 200 are of varying heights and rise, to different levels, above the upper surface 2a of the electrical component 2. As a result, the upper surface 2a is unlikely to be flat, and if a test probe's electrode contact (not shown in FIG. 3A) were to be propped against the subsidiary electrodes 200, it might not have made direct contact with some of them, and might have been damaged by a few of the more elevated subsidiaries 200. The conducting flexible layer 3 in step S10 and the present embodiment is therefore preferably made of conductive and resilient material. One example of the layer 3 is a film of conducting polymer.

As step S12 is shown in FIG. 3B, an electrode contact 40 (first electrode contact) is driven so that a first end 40a of the electrode contact 40 is electrically connected to the subsidiary electrodes 200 via the conducting flexible layer 3. Due to its thickness, the layer 3 is practically a buffer between the electrode contact 40 and the subsidiaries 200. The electrode contact 40 may be propped against the subsidiaries 200 without the first end 40a making direct contact with them, so there is little chance that the contact 40 be damaged by the few more elevated subsidiary electrodes 200. Also thanks to its elasticity, the conducting flexible layer 3 may be partially and temporarily deformed when compressed between the electrode contact 40 and the subsidiaries 200 on the upper surface 2a. Filling the crevices around individual subsidiary electrodes 200, the conducting flexible layer 3 serves as a path for current transmission between the first end 40a and the subsidiaries 200, electrically connecting the electrode contact 40 with the electrode 20. In other words, the conducting flexible layer 3 can fit nicely with, and even envelop some of, the subsidiary electrodes 200. With the layer 3 as a medium, the electrode contact 40 can be electrically connected to the subsidiaries 200 more secured in angle and position, and more effective in transmitting voltage and current.

As shown in FIG. 3B, an electrode contact 42a (second electrode contact) is driven so that a second end 420a of the electrode contact 42a is electrically connected to the electrode 22a (second electrode). In one example, the contact 42a is a needle-like structure whose pointed end 420a is propped against the electrode 22a and readily forms a path for current transmission between the electrode contact 42a and the electrode 22a. Please note that the contact between the first end 40a of the electrode contact 40 and the conducting flexible layer 3 may be two-dimensional so as to retain the good electrical connection, while the contact between the second end 420a of the electrode contact 42a and the electrode 22a may be established on a single point. Consequently, the area of the first end 40a may be greater than that of the second end 420a. In additional, there may be more than one second electrode contact in the present embodiment. As steps S12 and S16 shown in FIG. 3B, for instance, the electrode contacts 42a and 42b are configured to be electrically connected to the electrodes 22a and 22b, respectively. The contact 42b may be acicular, too, its pointed second end 420b propped against the electrode 22b and readily forming a path for current transmission between the electrode contact 42b and the electrode 22b.

Figure 4A:
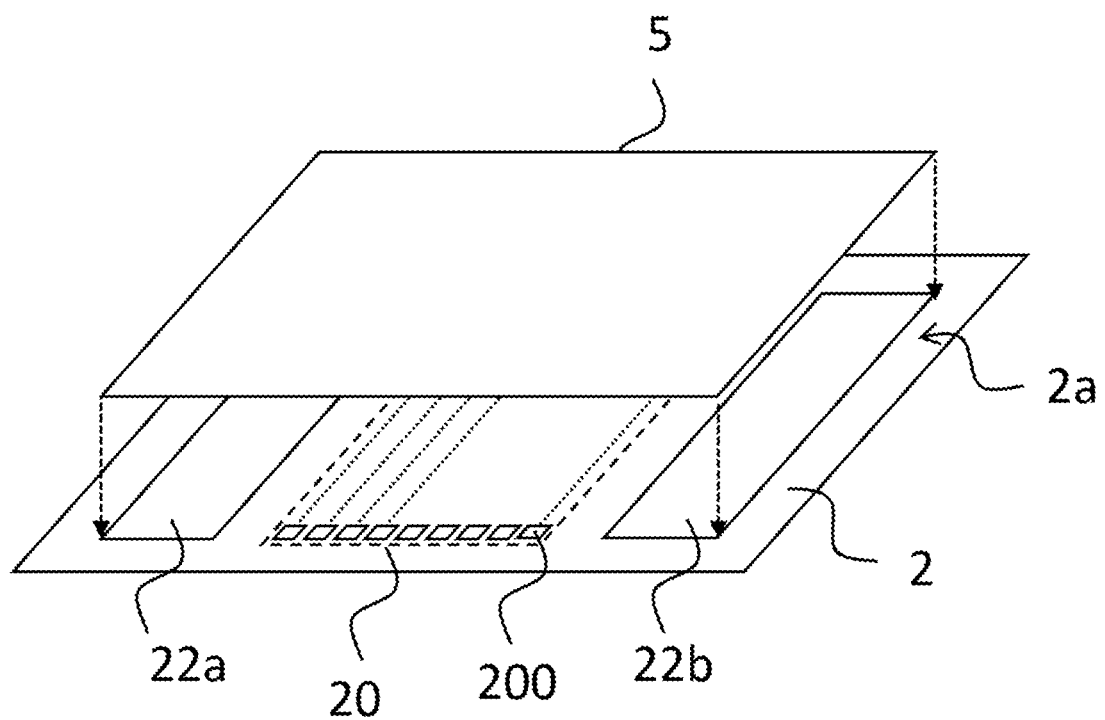
FIG. 4A depicts, based on FIG. 3A, the application of another conducting flexible layer.
Figure 4B:
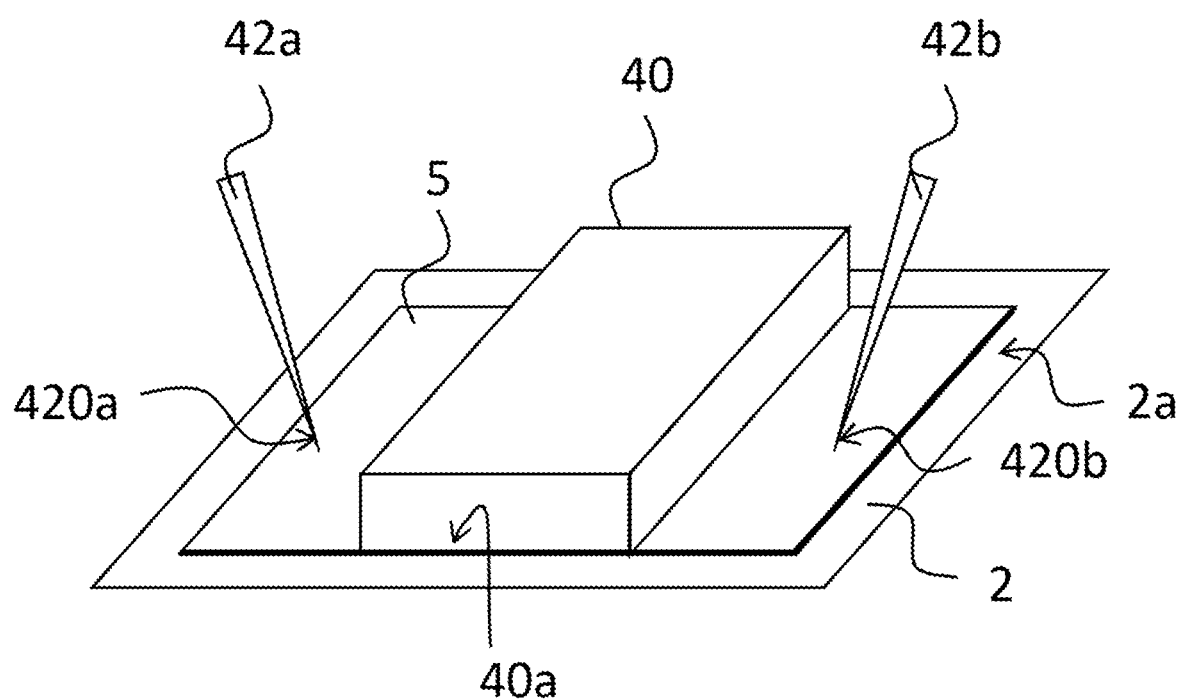
FIG. 4B depicts, based on FIG. 3B, the application of another conducting flexible layer.

In practice, the conducting flexible layer 3 may be an anisotropic film which is only conductive along the vertical direction from the electrode contact 40 to the subsidiary electrodes 200, and not at all horizontally. In other words, even if the coverage of the layer 3 had extended to another electrode, say the electrode 22a, there would not have been short circuits between the electrode contacts 40 and 42a. Please refer to FIGS. 4A and 4B in conjunction. Based on FIGS. 3A and 3B, respectively, FIGS. 4A and 4B depict the application of a conducting flexible layer 5, which is made also of conductive and resilient material and capable of spreading over most of the upper surface 2a, including the subsidiary electrodes 200 (or the electrode 20 in FIG. 2A) and the electrodes 22a and 22b. In one example, an anisotropic conductive film is chosen as the layer 5, so that even as it covers at once the electrodes 200, 22a, and 22b, there would be no short circuits formed between them. When the electrode contacts 40, 42a, and 42b are propped against the upper surface 2a, they are electrically connected to the electrodes 200, 22a, and 22b, respectively, via the conducting flexible layer 5.

In another example, the electrodes 200 (as a unit), 22a, and 22b are each covered with separate conducting flexible layers. When the electrode contacts 40, 42a, and 42b are propped against the upper surface 2a, they can still be electrically connected to the electrodes 200, 22a, and 22b, respectively, via their corresponding conducting flexible layers. To be noted, step S14 does not limit to FIGS. 4A and 4B shown the conducting flexible layer 5 is one-piece layer which covered the electrode contacts 40, 42a, and 42b at the same time, step S14 can also be applied to isolated conducting flexible layers covered the electrode contacts 40, 42a, and 42b separately.

The present invention hereby further discloses a test probe, which is a creation of the same technical concepts that begot said electrical component testing method. Please refer to FIG. 5. In accordance with an embodiment of the present invention, FIG. 5 depicts a test probe 6 configured to test the electrical component 2. Following the example of FIG. 2B, the electrical component 2 comprises at least the electrode 20 (first electrode) and the electrode 22a (second electrode), the electrode 20 in turn consisting of the subsidiaries 200 (first subsidiary electrodes). A person skilled in the art would no doubt agree that said test probe works with the unitary first electrode of FIG. 2A as well. Detailed structural description of the electrical component 2 can be found in relation to FIG. 2B or 2A and shall not be repeated here. The test probe 6 comprises an electrode contact 60 (first electrode contact), an electrode contact 62a (second electrode contact), and an electrode contact 62b. The contacts 60, 62a, and 62b correspond to the electrodes 200, 22a, and 22b, respectively. The electrode 20 or its subsidiaries 200 in particular are not explicitly shown in FIG. 5 because they are covered by the electrode contact 60 and because they have been represented in FIG. 2B.

The electrode contact 60 has a first end 60a, where a conducting flexible layer 600 (first conducting flexible layer) is disposed. Practically speaking, the conducting flexible layer 600 is configured to detachably contact the subsidiary electrodes 200; that is, the layer 600 is not disposed at the subsidiaries 200. Only when the electrical component 2 is to undergo tests does the electrode contact 60 approach the component 2 and have the conducting flexible layer 600 propped against the subsidiary electrodes 200, electrically connecting the first end 60a of the contact 60 with the subsidiaries 200 via the conducting flexible layer 600. The surface of the electrode 20 may be uneven inherently or because of the subsidiaries 200, but thanks to the thickness and elasticity of the buffering layer 600, the first end 60a does not directly contact the electrode 20 or 200, and the electrode contact 60 does not suffer damage from said unevenness.

The elasticity of the conducting flexible layer 600 also contributes to it being partially and temporarily deformed when propped against the subsidiary electrodes 200. Compressed into the crevices around individual subsidiaries 200, the conducting flexible layer 600 fits nicely with, and even envelops some of, the subsidiary electrodes 200. With the layer 600 as a medium, the electrode contact 60 can be electrically connected to the subsidiaries 200 more secured in angle and position, and more effective in transmitting voltage and current. In FIG. 5, the electrode contact 62a directly touches the electrode 22a using the second end 620a, and the electrode contact 62b directly touches the electrode 22b using the second end 620b, though other configurations exist in the present embodiment. Please note that both the contact between the first end 60a and the conducting flexible layer 600 and the contact between the layer 600 and the subsidiary electrodes 200 may be two-dimensional, while the contact between the second end 620a and the electrode 22a may be established on a single point. Consequently, the area of the first end 60a may be greater than that of the second end 620a.

Figure 6:
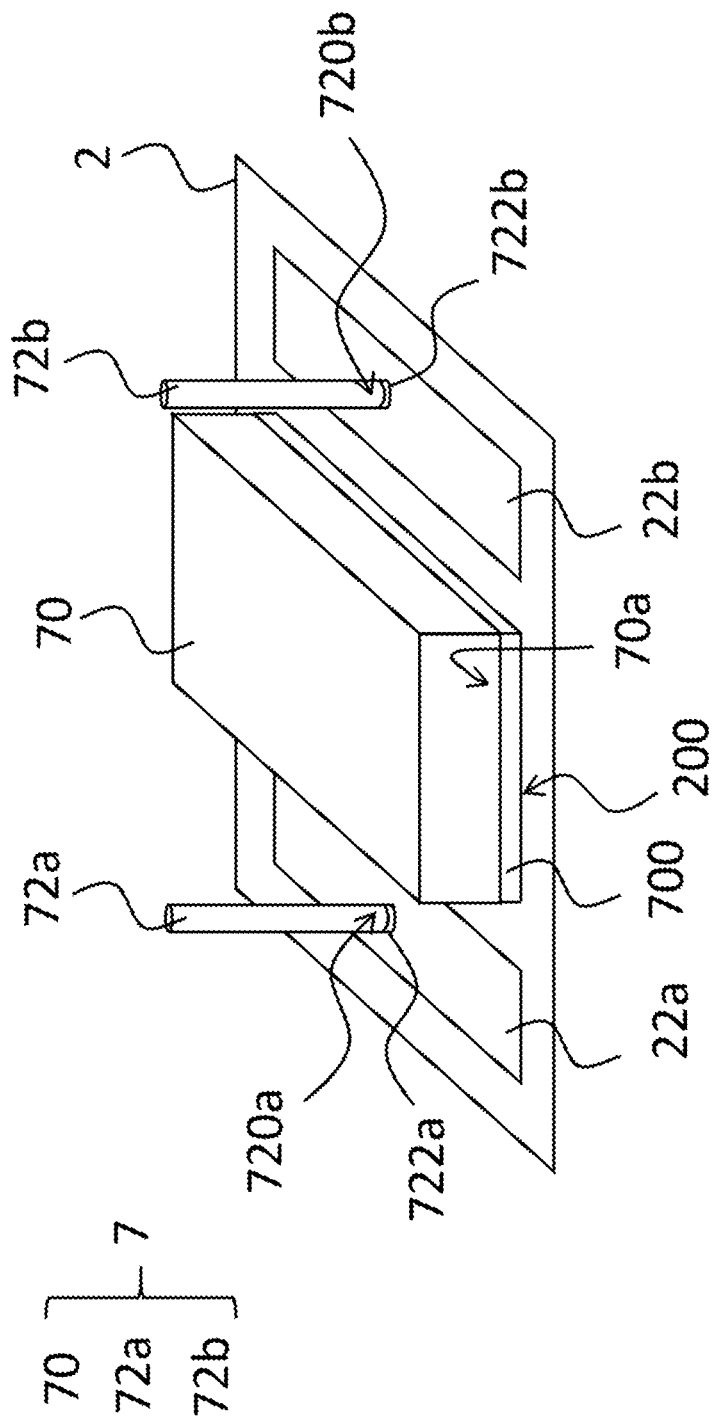
FIG. 6 depicts a test probe and an electrical component, in accordance with another embodiment of the present invention.

In terms of the test probe 6 of the present embodiment, the electrode contacts 62a and 62b may not be needle-like structures, and need not have the second ends 620a and 620b directly propped against the electrodes 22a and 22b, respectively. Please refer to FIGS. 5 and 6 in conjunction. FIG. 6 depicts the electrical component 2 and a test probe 7, in accordance with another embodiment of the present invention. The test probes 6 and 7 are similar in that the latter has analogous electrode contacts 70, 72a, and 72b, and that the contacts 70, 72a, and 72b correspond to the electrodes 200, 22a, and 22b, respectively. Like the contact 60, the contact 70 has a first end 70a, where a conducting flexible layer 700 (first conducting flexible layer) is disposed. Like the conducting flexible layer 600, the layer 700 is configured to detachably contact the subsidiary electrodes 200; that is, the layer 700 is not disposed at the subsidiaries 200.

What sets FIG. 6 and the test probe 7 in particular apart is that the electrode contacts 72a and 72b are not acicular. In other words, the contact between a second end 720a of the contact 72a and the electrode 22a and the contact between a second end 720b of the contact 72b and the electrode 22b are two-dimensional. There may be a conducting flexible layer 722a (second conducting flexible layer) disposed at the second end 720a, and another conducting flexible layer 722b disposed at the second end 720b. The layers 722a and 722b are configured to detachably contact the electrodes 22a and 22b, respectively. According to the present embodiment, the conducting flexible layers 700, 722a, and 722b need not be made of the same material. The layers 700, 722a, and 722b may or may not be anisotropic conductive films.

To summarize: A conducting flexible layer serves as a medium between an electrode and an electrode contact in the electrical component testing method and the test probe provided by the present invention. Covering the uneven surface of the electrode with the elastic, relatively smooth layer before the electrode contact approaches the electrode reduces measurement errors and inaccuracy. When the electrode consists of many minuscule subsidiaries, the conducting flexible layer has the additional bonus of being able to cover them at once, removing the burden to connecting them one by one electrically. The present invention, therefore, is applicable to various patterned electrodes.

What is claimed is:

1. An electrical component testing method for testing an electrical component, the electrical component comprising at least a first electrode and a second electrode, the electrical component testing method comprising:
   covering the first electrode with a first conducting flexible layer, the first conducting flexible layer being an anisotropic conductive film;
   driving a first electrode contact to electrically connect a first end of the first electrode contact with the first electrode via the first conducting flexible layer;
   covering the second electrode with a second conducting flexible layer; and
   driving a second electrode contact to electrically connect a second end of the second electrode contact with the second electrode via the second conducting flexible layer,
   wherein the first electrode consists of a plurality of first subsidiary electrodes, and the first conducting flexible layer covers at least part of the first subsidiary electrodes,
   wherein the first electrode and the second electrode are separated by a first distance, the first subsidiary electrodes are spaced a second distance apart, and the first distance is greater than the second distance.

2. The electrical component testing method according to claim 1, further comprising:
   covering the second electrode with the first conducting flexible layer;
   wherein when the second electrode contact is driven, the second end of the second electrode contact is electrically connected with the second electrode via the first conducting flexible layer.

3. The electrical component testing method according to claim 1, wherein the area of the first end is greater than the area of the second end.

4. A test probe for testing an electrical component, the electrical component comprising at least a first electrode and a second electrode, the test probe comprising:
   a first electrode contact having a first end, wherein a first conducting flexible layer is disposed at the first end and configured to detachably contact the first electrode;
   a second electrode contact having a second end, the second end configured to contact and be electrically connected with the second electrode detachably;
   wherein when the first conducting flexible layer contacts the first electrode, the first end is electrically connected with the first electrode via the first conducting flexible layer,
   wherein the first electrode consists of a plurality of first subsidiary electrodes, and when the first conducting flexible layer contacts the first electrode, the first conducting flexible layer covers at least part of the first subsidiary electrodes,
   wherein the first electrode and the second electrode are separated by a first distance, the first subsidiary electrodes are spaced a second distance apart, and the first distance is greater than the second distance.

5. The test probe according to claim 4, wherein the first conducting flexible layer is an anisotropic conductive film.

6. The test probe according to claim 5, wherein there is further a conducting adhesive layer between the first end and the first conducting flexible layer.

7. The test probe according to claim 4, wherein:
   a second conducting flexible layer is disposed at the second end of the second electrode contact and configured to detachably contact the second electrode; and
   when the second conducting flexible layer contacts the second electrode, the second end is electrically connected with the second electrode via the second conducting flexible layer.

8. The test probe according to claim 4, wherein the area of the first end is greater than the area of the second end.

* * * * *